(12) United States Patent
Halter

(10) Patent No.: US 9,927,482 B2
(45) Date of Patent: Mar. 27, 2018

(54) ELECTROSTATIC PROTECTION TESTING, MONITORING, AND HUMAN-MACHINE VISUAL INTERFACE SYSTEM AND METHODS OF USE

(71) Applicant: The United States of America as represented by the Secretary of the Navy, Washington, DC (US)

(72) Inventor: Mark Halter, Washington, IN (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 217 days.

(21) Appl. No.: 14/928,600

(22) Filed: Oct. 30, 2015

(65) Prior Publication Data

US 2016/0341775 A1   Nov. 24, 2016

Related U.S. Application Data

(60) Provisional application No. 62/165,645, filed on May 22, 2015.

(51) Int. Cl.
*G01R 31/00* (2006.01)
*G01R 31/02* (2006.01)
*G08B 21/00* (2006.01)
*G01R 27/02* (2006.01)

(52) U.S. Cl.
CPC ......... *G01R 31/026* (2013.01); *G01R 31/001* (2013.01); *G01R 27/025* (2013.01); *G01R 31/021* (2013.01); *G08B 21/00* (2013.01)

(58) Field of Classification Search
USPC .......................................................... 702/58
See application file for complete search history.

(56) References Cited

U.S. PATENT DOCUMENTS

| 4,800,374 A * | 1/1989 | Jacobson | G01R 27/20 324/509 |
| 5,991,145 A * | 11/1999 | Lagrotta | H05F 3/02 361/212 |
| 6,078,875 A * | 6/2000 | Jubin | G01R 31/001 324/500 |
| 2010/0019914 A1* | 1/2010 | Lin | A61N 1/08 340/649 |
| 2013/0226476 A1* | 8/2013 | Samreth | G06F 11/3058 702/57 |
| 2013/0289901 A1* | 10/2013 | Samreth | G01R 1/025 702/58 |

* cited by examiner

*Primary Examiner* — Paul D Lee
(74) *Attorney, Agent, or Firm* — Christopher A. Monsey

(57) ABSTRACT

Various electrostatic protection testing, monitoring, and human-machine visual interface systems and methods are provided. Embodiments include systems and methods for implementing an automated grounding wrist strap assembly test system and visual interface. Embodiments include a test station interface section, a computer system coupled with the test station interface section, software operable to control the test station and computer system, and a user interface that tracks dates of testing a ground strap or system and generates color coding associated with various status of testing of each tracked strap. Additional embodiments include access control systems that allow or deny access to entryways, access points, equipment stations as well as disabling operation of equipment. Embodiments also include a variety of warning systems that trigger based on pass or fail conditions.

42 Claims, 13 Drawing Sheets

- Private Function TestWristStrap(ValueMeasured as Double) As String — 751
- Private Function CheckNIError(ErrorCode as ViStatus) as ViBoolean — 753
- Public Sub Sleep(NumberOfSeconds As Single) — 755
- Private Sub cmdValidation_Click() — 757
- Private Sub Command1_Click() — 759
- Private Function InitializeDMM() As String — 761
- Private Sub SaveTestResult(ValueMeasured As Double, ByVal WristStrap As String) — 765
- Private Sub ReadTestResults(ByVal WristStrap As String) — 767
- Private Sub Form_Load() — 769
- Public Sub TestWS(ThisCommandButton As CommandButton) — 771
- Private Sub tmrCheckElapsedTime_Timer() — 773
- Public Sub DisplayHistory(ThisCommandButton As CommandButton) — 775

FIG. 7b

ELECTROSTATIC PROTECTION TESTING, MONITORING, AND HUMAN-MACHINE VISUAL INTERFACE SYSTEM AND METHODS OF USE

CROSS-REFERENCE TO RELATED APPLICATIONS

The present application claims priority to U.S. Provisional Patent Application Ser. No. 62/165,645, filed May 22, 2015, entitled "AUTOMATED GROUNDING WRIST STRAP SYSTEM," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,248) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates electrostatic protection testing, monitoring, and human-machine visual interface systems and methods of use including user interfaces facilitate management and testing of grounding wrist strap assemblies with various aspects that reduce human error and provide various automation features and systems. More particularly, exemplary embodiments are directed to providing automation and visual interfaces associated with testing electrical resistance of grounding wrist strap assemblies, recording grounding wrist strap assembly measured electrical resistance measurement value(s) in an electronic file, and providing a user interface that graphically indicates users and other staff, e.g., quality control, management, etc., whether a detected measured electrical resistance measurement value falls between a predetermined range of range of allowed measured electrical resistance measurement values associated with a functioning grounding wrist strap assembly.

Some embodiments of the invention address a need to simplify and automate various aspects or processes related to resistance testing of grounding wrist strap assemblies. Some exemplary embodiments are also directed to addressing a need to reduce human error in reading and recording measured electrical resistance measurement values of grounding wrist strap assemblies that are integrated into work activities and industrial process design and analysis including worker movements through a facility to electrostatic protected workstations. Some embodiments are integrated into facility and equipment automation systems including entry control systems, workstation operation systems, and visual interface systems at, for example, user locations and quality control or management user interfaces.

According to an illustrative embodiment, the present invention can comprise grounding wrist strap assembly testing software adapted for executing a series of computations and generating results and wrist strap tester software interface equipment. In various embodiments the grounding wrist strap assembly tester software interface equipment can further comprise a grounding wrist strap testing system personal computer (PC), a Digital Multi-meter (DMM) card, and a test interface station.

For example, an embodiment can provide a solution to meet unmet needs that includes automatically recording measured electrical resistance measurement value(s) of grounding wrist strap assemblies, automatically determining whether measured electrical resistance measurement value(s) fall below, within, or above a predetermined range of allowed measured electrical resistance measurement values, and graphically indicating whether tested grounding wrist strap assemblies' electrical resistance has "passed" or "failed" according to the predetermined range of allowed measured electrical resistance measurement values.

An additional embodiment can provide unmet solutions by automatically storing and organizing recorded measured electrical resistance measurement value(s) associated with a user of a particular grounding wrist strap assembly, as well as recording a time a specifically identified grounding wrist strap assembly was last tested, comparing said time with a current time and provide a graphical indication to the user of that particular grounding wrist strap assembly and other interested parties (via computer-based interfaces) of an amount of time elapsed between testing events.

Another embodiment can provide a means of selecting a desired name from a list of previously established users and displaying associated grounding wrist strap assembly information to a user. For example, grounding wrist strap assembly information can include all previous measured electrical resistance measurement values for a specified grounding wrist strap assembly and a color code system that indicates an urgency to perform a grounding wrist strap assembly electrical resistance test based on predetermined time ranges. For example, time ranges for a color code system can be defined as "yellow," indicating a last testing event has not occurred within four hours of a current (e.g., test) time, and "orange," indicating a last testing event has not occurred within six hours of the current time.

An additional embodiment can provide a graphical color code indication system to describe whether a grounding wrist strap assembly currently being tested has "failed" or "passed." For example a graphical indication of "green" can indicate that a currently tested grounding wrist strap assembly has passed an electrical resistance test based on the predetermined set of allowed measured electrical resistance measurement values while a graphical indication of "red" can indicate that the currently tested grounding wrist strap assembly has failed an electrical resistance test again based on the predetermined set of parameters.

Another feature can include a means of predicting a failure event. For example, a machine implementation can be created which records measured electrical resistance measurement values from a previous week, compares them to a current week, and, if the recorded measured electrical resistance measurement values differ by a predetermined amount, for example 100,000 ohms, determines a projected date when recorded electrical resistance measurement value(s) will fall below a predetermined acceptable level.

Another embodiment of this invention can be incorporated into a security system for a building or a workplace where static charge checks would be necessary. A grounding wrist strap assembly electrical resistance testing system comprising an apparatus and software as described above could be integrated into a security system for a workplace location at various access points into and out of a desired location. Along with security measures (e.g. a user-specific magnetic keycard), the security system can also require grounding wrist strap assembly electrical resistance testing before allowing passage into or out of the location. Since grounding wrist strap assembly electrical resistance tests could be required to enter or leave a location, stored user test data, including a date and time, could also reveal which users are present in the location at a given time. If a plurality of access points are present each with its own grounding wrist strap assembly electrical resistance testing system 1, the exemplary apparatus could also record at which access point a user's grounding wrist strap electrical resistance test had occurred by a unique identification number or name for each access point.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIGS. 7a and 7b show a simplified diagram of system segments and subroutine structure relationships in exemplary software for an exemplary grounding wrist strap assembly electrical resistance testing system;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
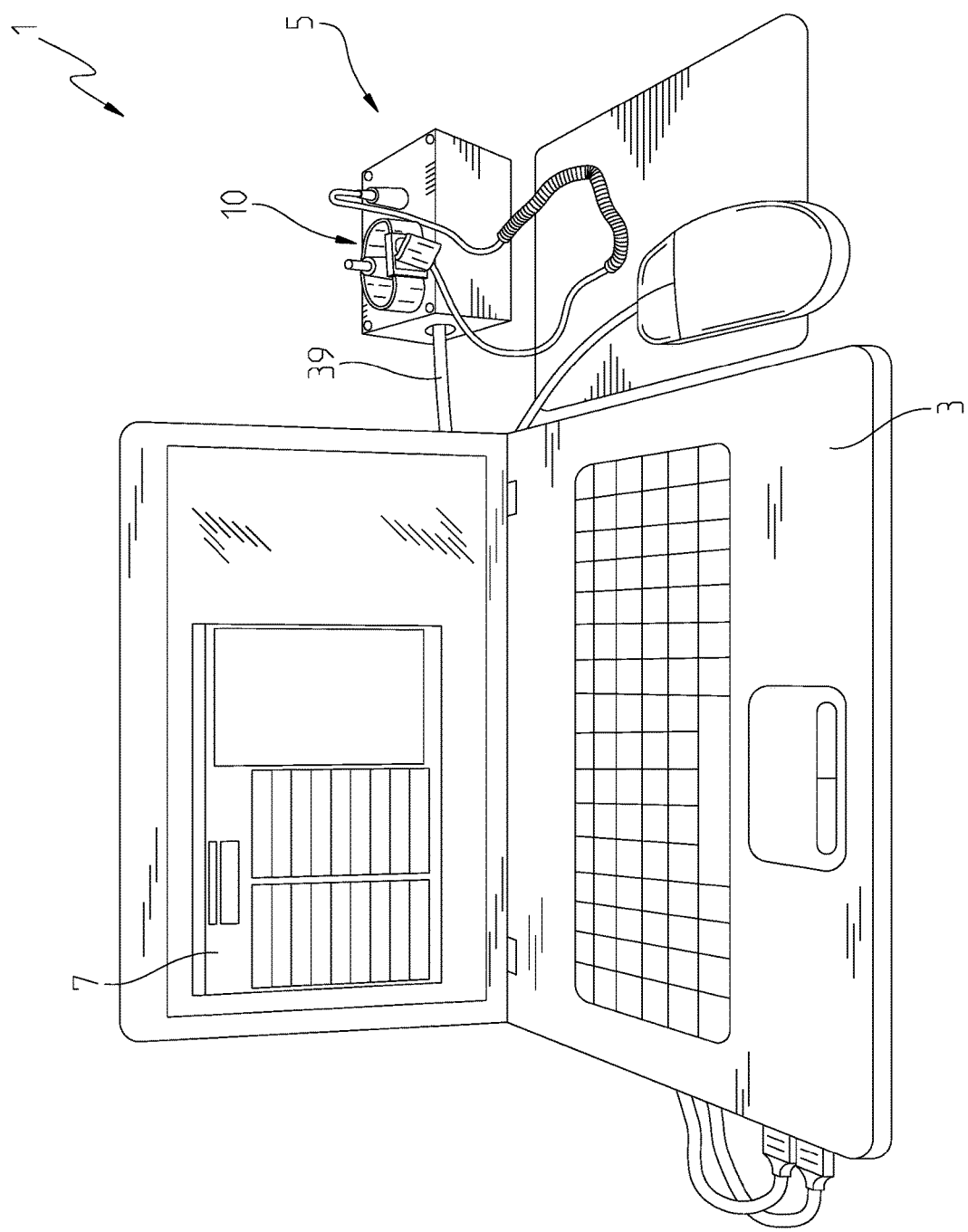
FIG. 1 shows a grounding wrist strap assembly electrical resistance testing system in accordance with one exemplary embodiment of the invention.

Referring initially to FIG. 1, an illustrative embodiment is shown. A grounding wrist strap assembly electrical resistance testing system 1 comprises a grounding wrist strap assembly electrical resistance testing system PC 3 with computer programs implementing various elements of one exemplary embodiment of the invention, a DMM (not shown, see 9, FIG. 4), and a test interface station 5. The exemplary grounding wrist strap assembly electrical resistance testing system PC 3 displays a main GUI 7 generated by the computer programs on the exemplary grounding wrist strap assembly electrical resistance testing system PC 3 and is in electrical communication with the DMM 9 and the test interface station 5. A cable 39 provides electrical communication. A grounding wrist strap assembly 10 is also provided for use with the grounding wrist strap assembly electrical resistance testing system 1.

Figure 2B:
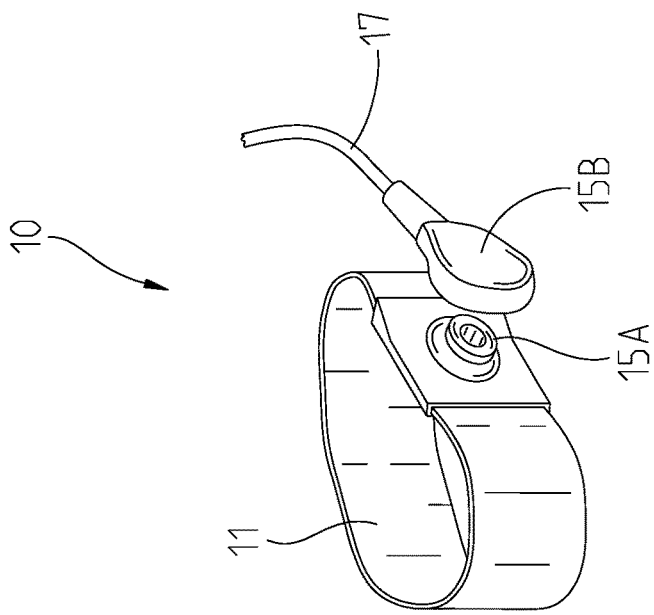
FIG. 2b shows another view of an exemplary embodiment of a grounding wrist strap assembly.
Figure 2A:
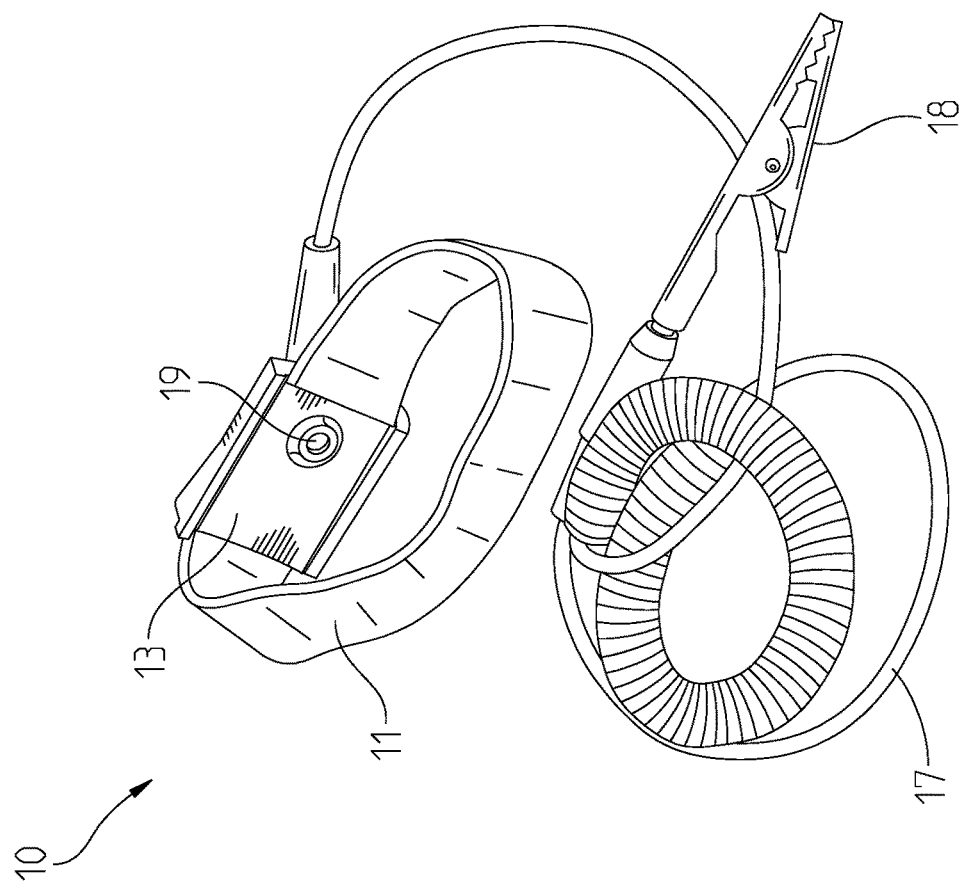
FIG. 2a shows an exemplary embodiment of a grounding wrist strap assembly.

FIG. 2a and FIG. 2b show different views of an exemplary embodiment of a grounding wrist strap assembly 10 that can be tested by the exemplary grounding wrist strap assembly testing system 1. In various embodiments, a number of different users have their own issued personal grounding wrist strap assembly 10 that are issued to each user for their specific use. Different grounding wrist strap assemblies 10 are tracked by exemplary grounding wrist strap assembly electrical resistance testing systems 1. For ease of discussion, at least portions of this specification will discuss one exemplary grounding wrist strap assembly 10, but it should be understood that various embodiments of the invention will track any number of such grounding wrist strap assemblies 10 including ones shown herein as well as others. The exemplary grounding wrist strap assembly 10 includes an adjustable wristband 11, a metal plate 13 coupled to the adjustable wristband 11 on an interior side of the adjustable wristband 11 configured to provide an electrical connection with a user's wrist area's skin, an electrical terminal connector, e.g., a male snap adapter 15A, positioned on an external side of the adjustable wristband 11 configured to connect with a female snap adapter 15B connected to a grounding wire 17 that terminates in an electrical quick disconnect connector 18 (e.g. alligator clip, banana jack, etc.), and a conductive coupler 19, e.g., a metal rivet, that connects the metal plate 13 with the electrical terminal connector, e.g., the male snap adapter 15A.

Figure 3:
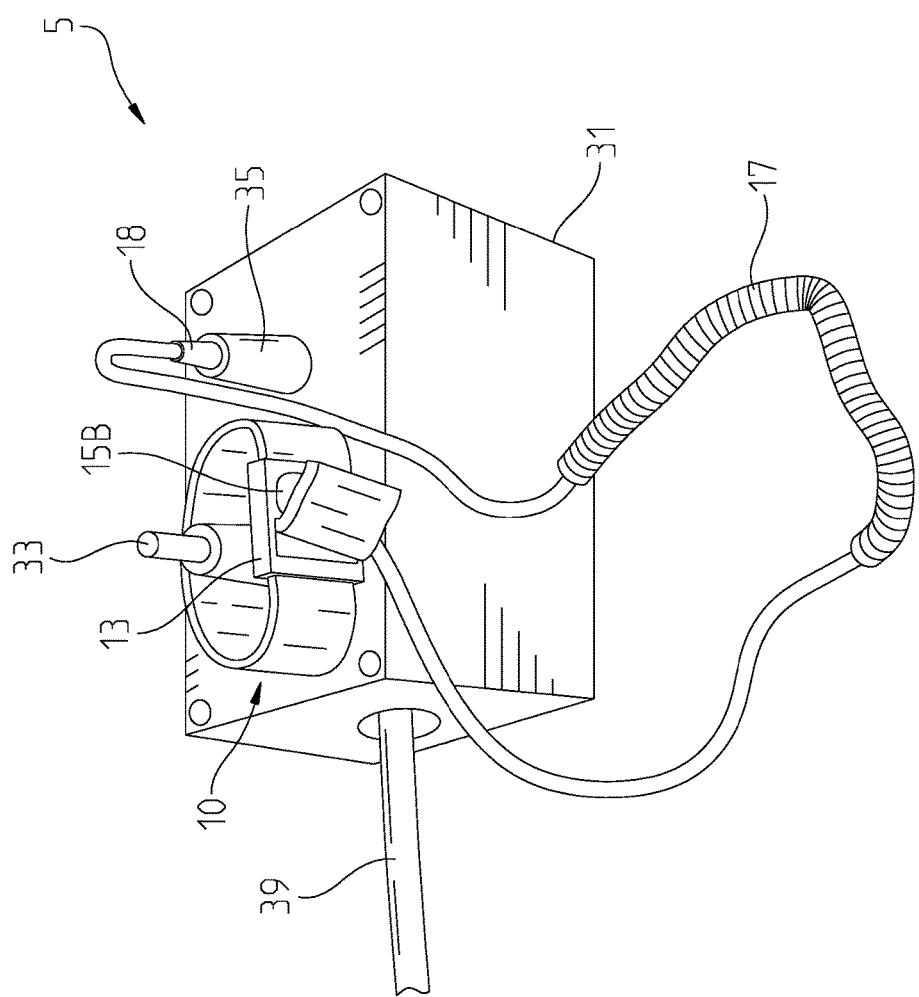
FIG. 3 shows an exemplary embodiment of a grounding wrist strap assembly connected to a test interface station.

FIG. 3 shows an exemplary embodiment of the test interface station 5 of the exemplary grounding wrist strap assembly electrical resistance testing system 1 in use. The test interface station 5 includes a structural housing 31, a conductive post 33, an electrical receiving receptacle 35, and a cable 39 that maintains electrical communication between the test interface station 5, DMM (not shown, e.g. see 9, FIG. 4), and grounding wrist strap assembly electrical resistance testing system PC 3. For testing, the exemplary grounding wrist strap assembly 10 has its metal plate 13 in physical and electrical contact with the conductive post 33. The electrical quick disconnect connector 18 (e.g. a banana jack) that terminates the wire 17 that is connected to the female snap adaptor 15B of the grounding wrist strap assembly 10 is connected to the electrical receiving receptacle 35. The test interface station 5 is configured such that electrical signals can be run through the grounding wrist strap assembly 10 and communicated to the DMM 9 and grounding wrist strap assembly electrical resistance testing system PC 3 by at least one cable including cable 39.

Figure 4:
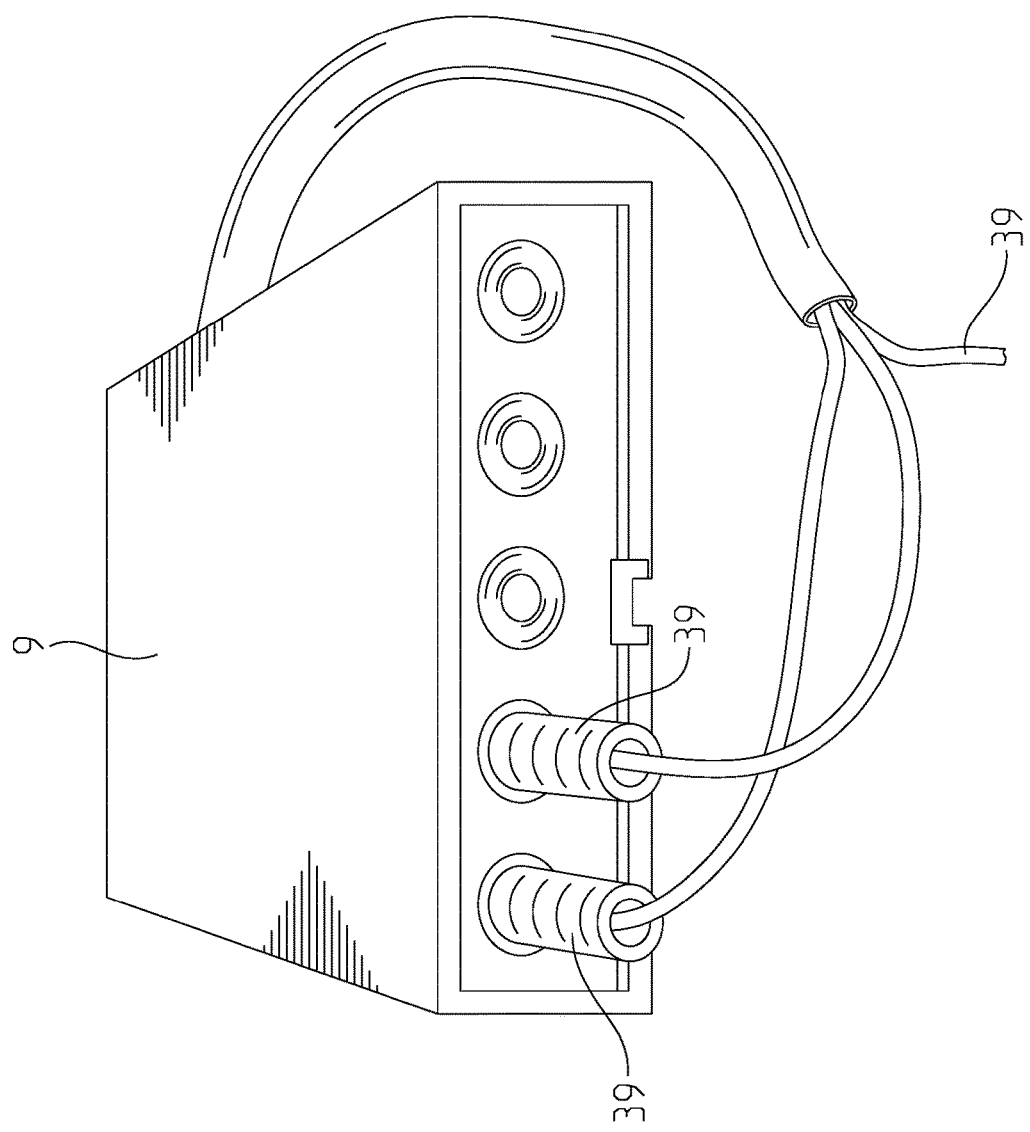
FIG. 4 shows an exemplary DDM.

FIG. 4 shows an exemplary DMM 9 to be used for electrical resistance testing with the exemplary grounding wrist strap assembly electrical resistance testing system 1 to make electrical resistance measurements of an exemplary grounding wrist strap assembly 10. The DMM 9 includes a power supply (not shown) and cable 39 that provide electrical communication between the DMM 9 and the test interface station 5. Another cable (not shown) connects the DMM 9 with grounding wrist strap assembly electrical resistance testing system PC 3.

Figure 5:
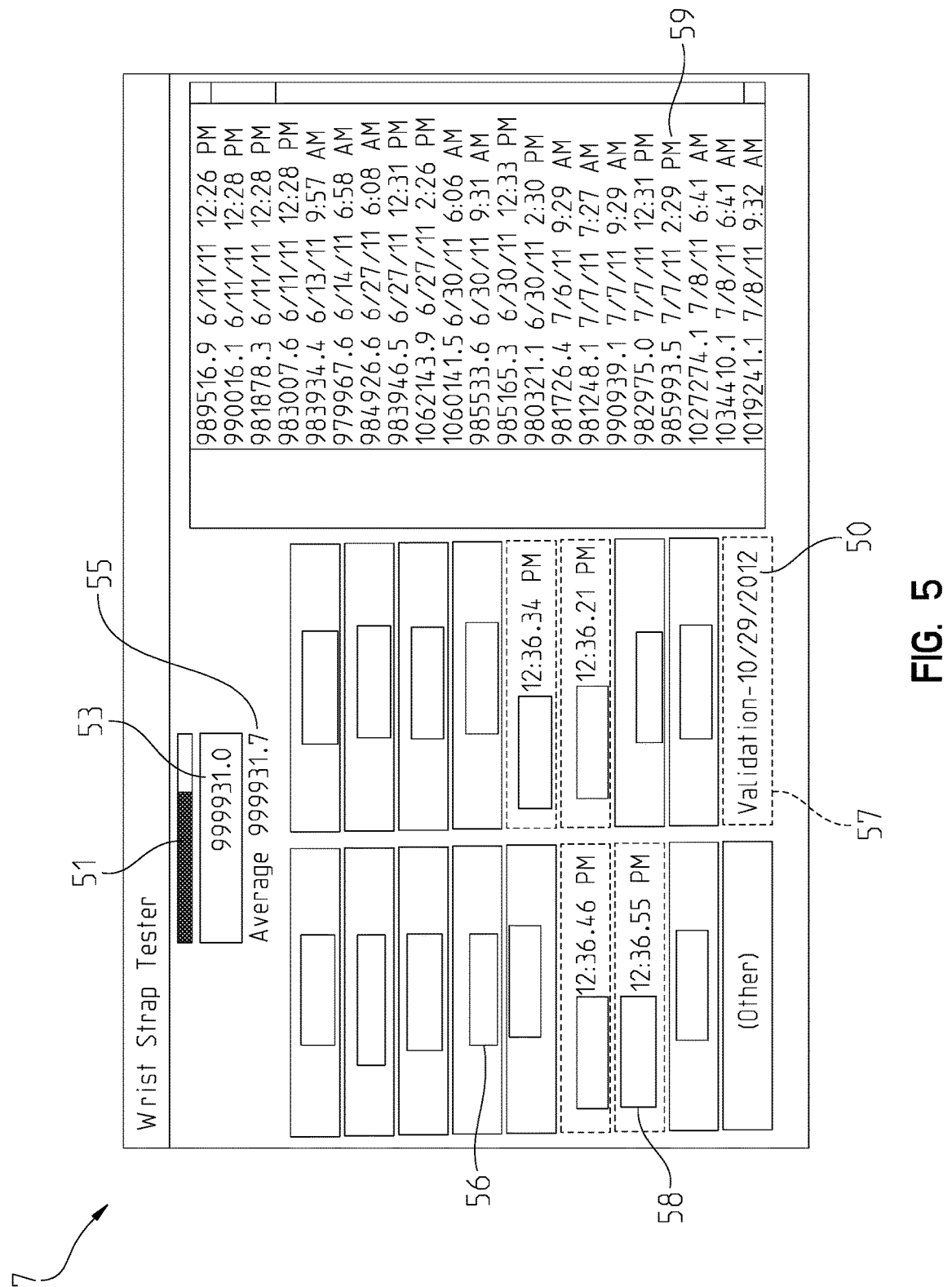
FIG. 5 shows an exemplary main graphical user interface (GUI) displayed on a display by an exemplary grounding wrist strap assembly electrical resistance testing system PC.

FIG. 5 shows an exemplary main GUI 7 to be displayed by the grounding wrist strap assembly electrical resistance testing system PC 3 of the illustrative grounding wrist strap assembly electrical resistance testing system 1. Features of the main GUI 7 include a testing progress bar 51, a currently measured electrical resistance measurement value 53, an average of a predetermined number of measured electrical resistance measurement values 55, a profile list 57 comprising selectable user identification element(s) 56 (e.g. names) and a testing interface validation option 50, a list of past saved measured electrical resistance measurement value(s) 59 associated with a selected user, and at least one GUI colored grounding wrist strap assembly status indicator 58. In this example, the GUI colored grounding wrist strap assembly status indicator 58 can be one of multiple different colored backgrounds (e.g., green, yellow, red, etc. associated with different resistance test results such as green for test passed and red for test fail) for the selectable user identification element(s) 56 from the profile list 57. The list of past measured electrical resistance measurement values 59 can also present a date and time of when past saved measurements occurred. The GUI colored grounding wrist strap assembly status indicator 58 is capable of displaying at least four different colors associated with a particular test result status. A first color, e.g. green, indicates a test "pass" and is displayed if a measured electrical resistance measurement value of the grounding wrist strap assembly 10 falls within a predetermined range of allowed measured electrical resistance measurement values (e.g. between 1 MΩ and 1.4 MΩ). A second color, e.g. red, indicates a test "fail" and is displayed if the measured electrical resistance measurement value of the grounding wrist strap assembly 10 falls outside the predetermined range of allowed measured electrical resistance measurement values (e.g. between 1 MΩ and 1.4 MΩ). A third color, e.g. yellow, is displayed when a user has not tested an associated grounding wrist strap assembly 10 within a first predetermined amount of time (e.g. more than four hours but less than six hours) since a previous testing event. A fourth color, e.g. orange, is displayed when a user has not tested an associated grounding wrist strap assembly 10 within a second predetermined amount of time (e.g. more than six hours) since a previous testing event. A user can manipulate the main GUI 7 via a mouse or keyboard to select a user identification element 56. As a result of various functions and subroutines (described below) of the grounding wrist strap assembly electrical resistance testing system PC 3, the main GUI 7 may present temporary pop-up message boxes (not shown) that can be closed by selecting a "close message box" option (not shown). Selecting a user identification element 56 also initiates electrical resistance testing by the grounding wrist strap assembly electrical resistance testing system 1.

Figure 6:
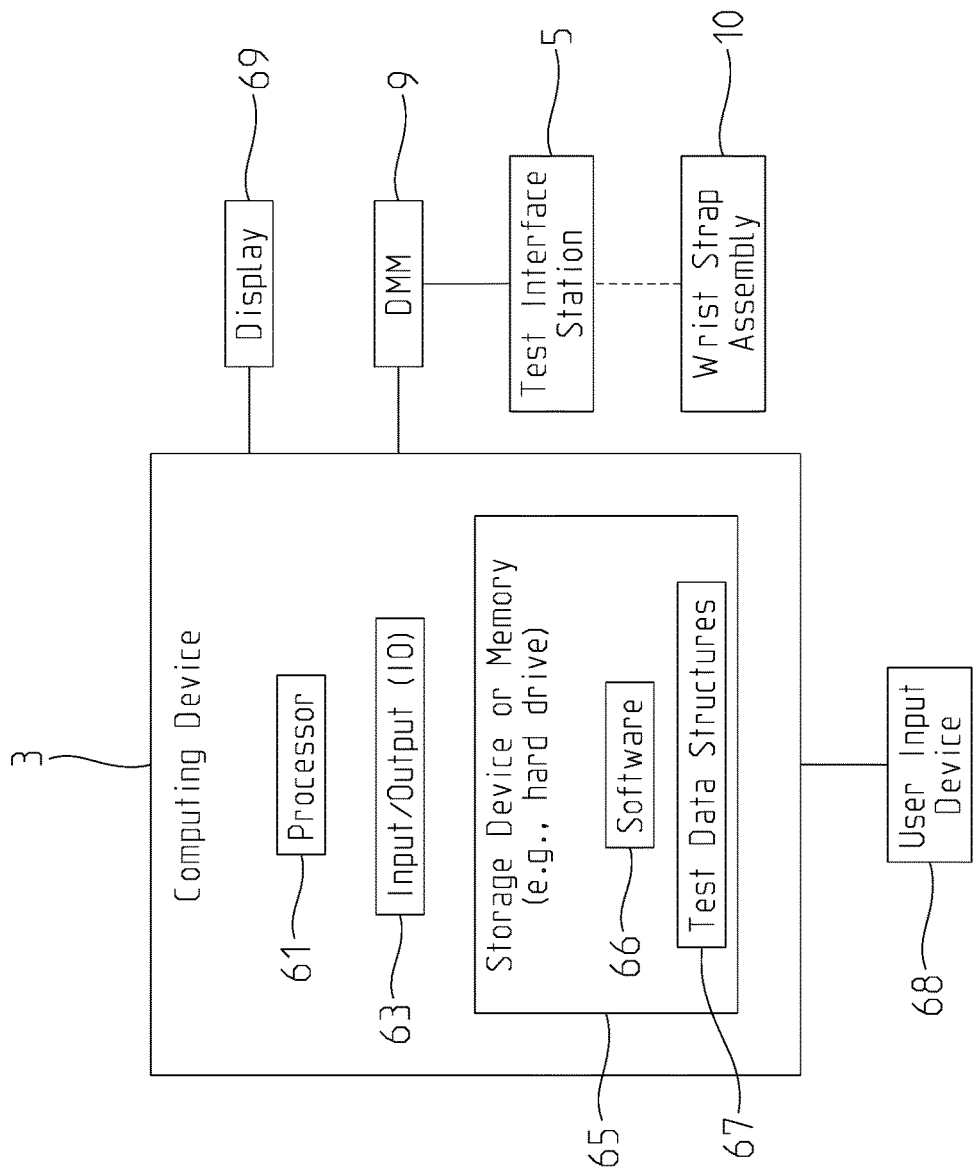
FIG. 6 shows a block diagram of hardware infrastructure in an exemplary grounding wrist strap assembly electrical resistance testing system.

FIG. 6 shows block diagram indicates the relationships between hardware components of an exemplary grounding wrist strap assembly electrical resistance testing system 1. The computing device 3 (e.g. the grounding wrist strap assembly electrical resistance testing system PC) comprises a processor 61, input/output (IO) devices 63 (e.g., serial port), a user input device 68 (e.g., keyboard and/or mouse), and a storage device or memory 65 (e.g. a hard drive) that contains machine readable instructions including software 66 and test data structures 67. The grounding wrist strap assembly electrical resistance testing system PC 3 is in electrical communication with a display 69, the user input device 68, and the DMM 9 that is in electrical communication with the test interface station 5. A grounding wrist strap assembly 10 can be temporarily connected to the test interface station 5 for electrical resistance testing.

Figure 7A:
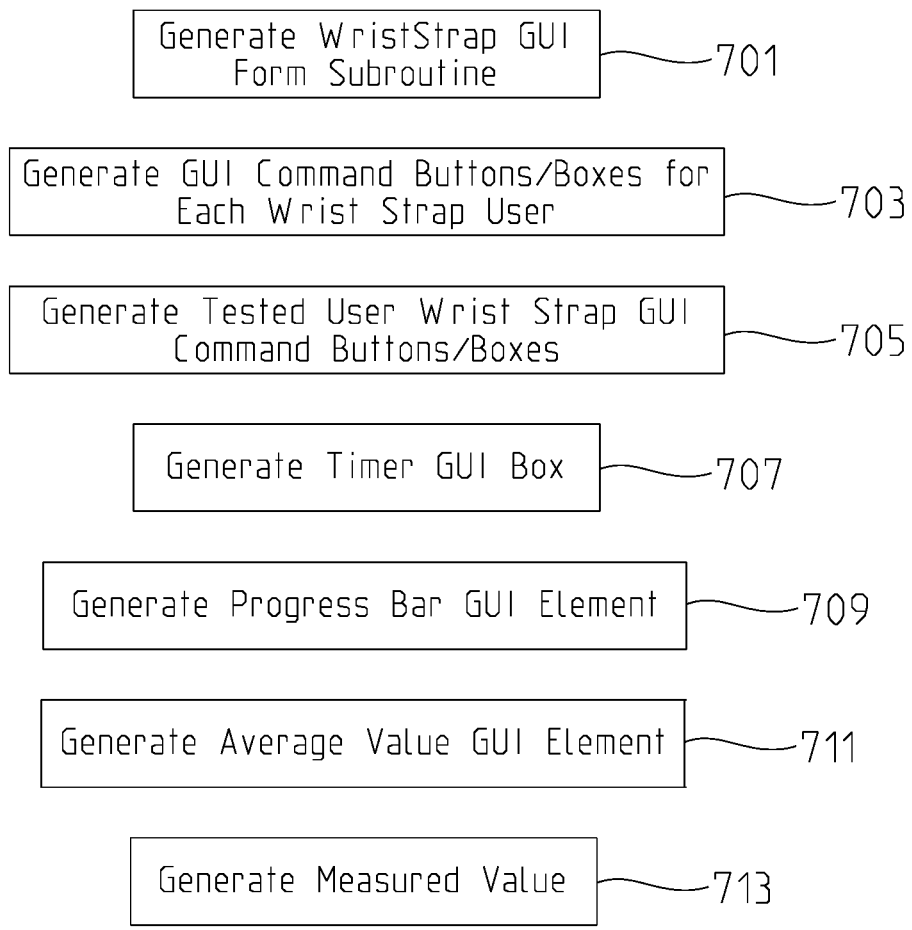

FIG. 7a shows the relationships between exemplary routines and subroutines of the exemplary software 66 to be used on the grounding wrist strap assembly electrical resistance testing system PC 3 of an embodiment of the grounding wrist strap assembly electrical resistance testing system 1. First, the main GUI 7 is generated on the display 69 when the processor 61 executes machine readable instructions contained in subroutine 701. Subroutine 701 comprises subroutines of generate command buttons that are boxes for each user 703 (e.g. the profile list 57 comprising selectable user identification element(s) 56), generate tested user command boxes 705 (e.g. the selectable user identification element(s) 56 of users that have recently tested associated grounding wrist strap assemblies 10; profiles with recently tested associated grounding wrist strap assemblies 10 can have a colored background that functions as the GUI colored grounding wrist strap assembly status indicator 58), generate timer box element 707 (not displayed on the main GUI 7, however can be used for backend or other calculations supporting various subroutines), generate progress bar element 709 (e.g. the testing progress bar 51), generate average value element 711 (e.g. the average of a predetermined number of measured electrical resistance measurement values 55), and generate measured value element 713 (e.g. the currently measured electrical resistance measurement value 53).

FIG. 7b shows further relationships between exemplary functions and subroutines of the exemplary software 66 to be used on the grounding wrist strap assembly electrical resistance testing system PC 3 for an embodiment of the grounding wrist strap assembly electrical resistance testing system 1. Subroutine Form_Load( ) 769 is used to initiate processing for the grounding wrist strap assembly electrical resistance testing system 1. Form_Load( ) 769 includes machine readable instructions read by processor 61 that declares and/or initializes various data structures or variables when the software 66 is run by a user. Private function InitializeDMM 761 includes machine readable instructions read by processor 61 that can include a string that initializes the DMM 9 a first time the DMM 9 is used by the software 66. Private function TestWristStrap 751 includes machine readable instructions read by processor 61 that can activate the DMM 9 to measure an electrical resistance measurement value of the grounding wrist strap assembly 10 at the conductive post 33 of the test interface station 5 until predetermined testing conditions are met (e.g. until three consecutive measured electrical resistance measurement values are within 3% of each other or until ten seconds expire). TestWristStrap 751 includes machine readable instructions read by processor 61 that stores measured electrical resistance measurement value(s) measured by the DMM 9 as a string named ValueMeasured. Private function CheckNIError 753 includes machine readable instructions read by processor 61 that compares a DMM test code output which is generated each time the DMM 9 performs an electrical resistance measurement with one or more stored DMM test codes to determine whether the DMM 9 has output an error code. For example, if the DMM 9 is operated and it detects an open circuit then the DMM 9 will output a specific DMM test code output, e.g., open circuit error code.

The CheckNIError 753 stores results of this comparison of stored DMM test codes with output DMM test code as a data variable ErrorCode as a ViBoolean and also as a ViStatus data type. If one of the error codes in a stored DMM test code list is matched with the output DMM test code the grounding wrist strap assembly electrical resistance testing system PC 3 displays an appropriate error message on the display 69 and discards an associated DMM 9 measured electrical resistance measurement value. CheckNIError 753 includes machine readable instructions read by processor 61 that comprises a call machine readable instructions from National Instruments Corporation® for their instruments, e.g. the DMM 9. If one of the error codes is received, the software 66 will direct the DMM 9 to take another electrical resistance measurement. Public subroutine Sleep 755 includes machine readable instructions read by the processor 61 that suspends measurement operations after a number of seconds defined by NumberOfSeconds data variable elapses. Private subroutine cmdValidation_Click( ) 757 includes machine readable instructions read by processor 61 that includes a procedure that determines if the DMM 9 and the test interface station 5 are calibrated. The private subroutine cmdValidation_Click( ) 757 includes machine readable instructions read by processor 61 that initiates the validation procedure which includes reading measured electrical resistance measurement values from the test interface station 5 when a calibrated load with a plurality of resistors, e.g. five resistors, is attached to the conductive post 33. The private subroutine cmdValidation_Click( ) 757 includes machine readable instructions read by processor 61 that can be executed when the validation option 50 is selected from the main GUI 7. Private subroutine Command1_Click( ) 759 includes machine readable instructions read by processor 61 that performs a TestWS 771 subroutine (see below) when a selectable user identification element 56 is selected on the main GUI 7. A unique subroutine like Command1_Click( ) 759 can be used for each different user profile or selectable user identification element 56 shown on the display 69. Public subroutine TestWS 771 includes machine instructions read by processor 61 that initiates the processor 61 to execute the TestWristStrap 751 function but further associates the resulting measured electrical resistance measurement values of the TestWristStrap 751 function with the selected user identification element 56 that prompted the Command1_Click( ) 759 subroutine. TestWS 771 also directs the processor 61 by machine readable instructions to determine whether a measured average of consecutive measured electrical resistance measurement values is within ("pass") or outside ("fail") of a predetermined range of allowed measured electrical resistance values (e.g. between 1 MΩ and 1.4 MΩ (mega-ohms)) and to display an associated color with a "pass" or "fail" on the GUI colored grounding wrist strap assembly status indicator 58. Private subroutine SaveTestResult 765 includes machine readable instructions read by processor 61 that saves data variables ValueMeasured (e.g., the measured electrical resistance measurement value(s)) and ByVal WristStrap (e.g. an identifier string that directs the processor 61 to save ValueMeasured in a data file for a specific selected user) in the storage device 65. Private subroutine ReadTestResult 767 includes machine readable instructions read by processor 61 that directs the software 66 to read the ByVal WristStrap data variable associated with the selected user profile from the storage device 65 and to display saved measured electrical resistance measurement values associated with that ByVal WristStrap string. Private subroutine tmrCheckElapsedTime_Timer( ) 773 includes machine readable instructions read by the processor 61 to display a third color, e.g. yellow, on the GUI colored grounding wrist strap assembly status indicator 58 of the main GUI 7 if a first predetermined time period, e.g., four hours, have passed since a previous electrical resistance test for an associated user's grounding wrist strap assembly 10. If a second predetermined time period, e.g. six hours, have passed since a previous electrical resistance test for an associated user's wrist strap assembly 10, private subroutine tmrCheckElapsedTime_Timer( ) 773 includes machine instructions read by processor 61 that updates the main GUI 7 to display a fourth color, e.g. orange, on the GUI colored grounding wrist strap assembly status indicator 58 for that user. Other embodiments of the invention may use different time limits to prompt the third and fourth colors or may include other numbers of colors with associated predetermined time limits. Public subroutine DisplayHistory 775 includes machine instructions read by processor 61 that instructs the software 66 to display grounding wrist strap assembly 10 testing history for different users and elements of their testing history stored in the storage device 65 on the main GUI 7.

Figure 8:
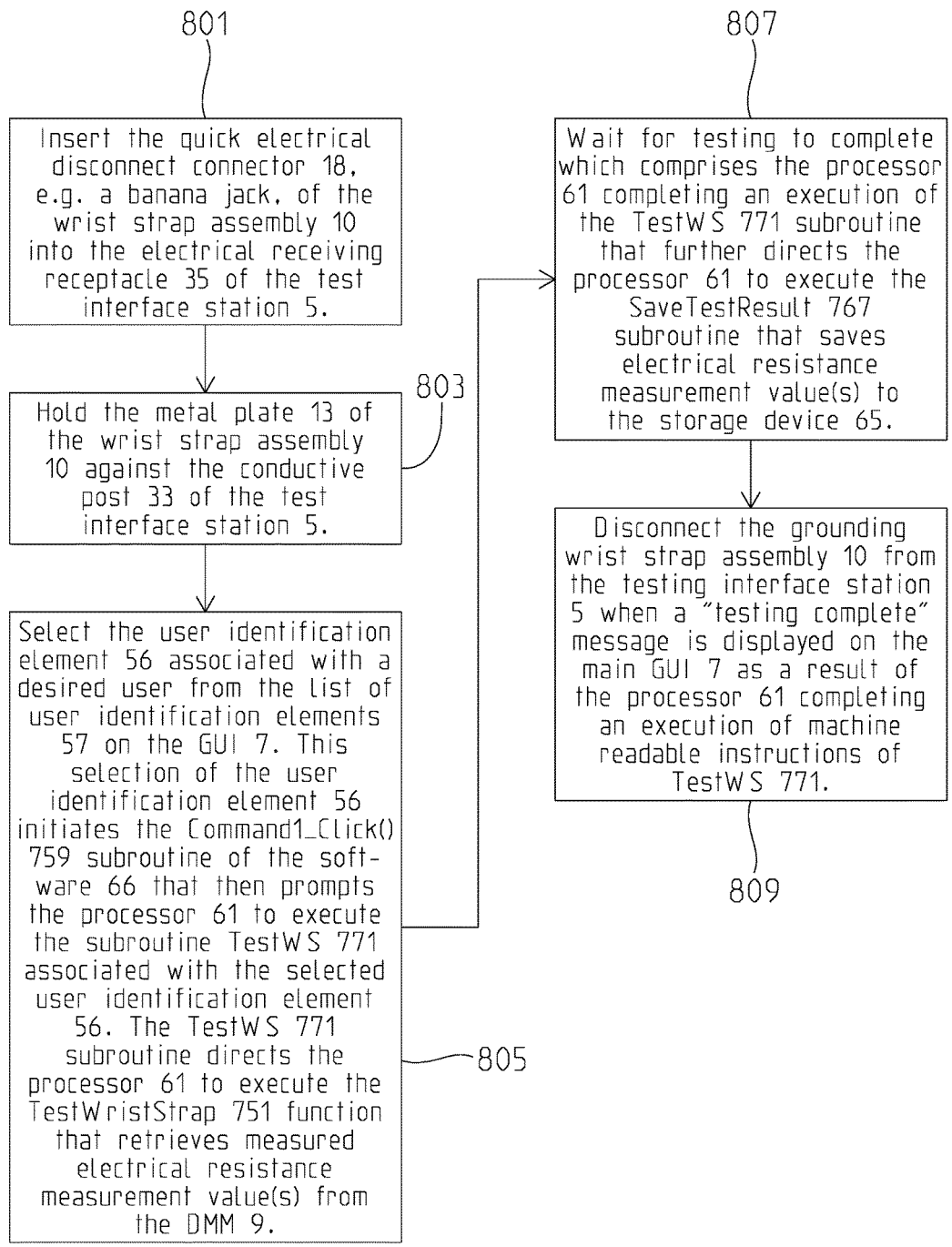
FIG. 8 shows an illustrative method of using an exemplary grounding wrist strap assembly electrical resistance testing system to test the electrical resistance of a grounding wrist strap assembly.

FIG. 8, presents an illustrative method of using an illustrative example of the grounding wrist strap assembly electrical resistance testing system 1 to test the electrical resistance of the grounding wrist strap assembly 10. At Step 801, insert the quick electrical disconnect connector 18, e.g. a banana jack, of the grounding wrist strap assembly 10 into the electrical receiving receptacle 35 of the test interface station 5. At Step 803, hold the metal plate 13 of the wrist strap assembly 10 against the conductive post 33 of the test interface station 5, and subsequently, at Step 805, select the user identification element 56 associated with a desired user from the list of user identification elements 57 on the main GUI 7 using the user input device 68. This selection of the user identification element 56 initiates the Command1_Click( ) 759 subroutine of the software 66 that then prompts the processor 61 to execute the subroutine TestWS 771 associated with the selected user identification element 56. The TestWS 771 subroutine directs the processor 61 to execute the TestWristStrap 751 function that retrieves measured electrical resistance measurement value(s) from the DMM 9. At Step 807, wait for testing to complete which comprises the processor 61 completing an execution of the TestWS 771 subroutine that further directs the processor 61 to execute the SaveTestResult 767 subroutine that saves electrical resistance measurement value(s) to the storage device 65. Finally, at Step 809, disconnect the grounding wrist strap assembly 10 from the testing interface station 5 when a "testing complete" message is displayed on the main GUI 7 as a result of the processor 61 completing an execution of machine readable instructions of TestWS 771.

Figure 9:
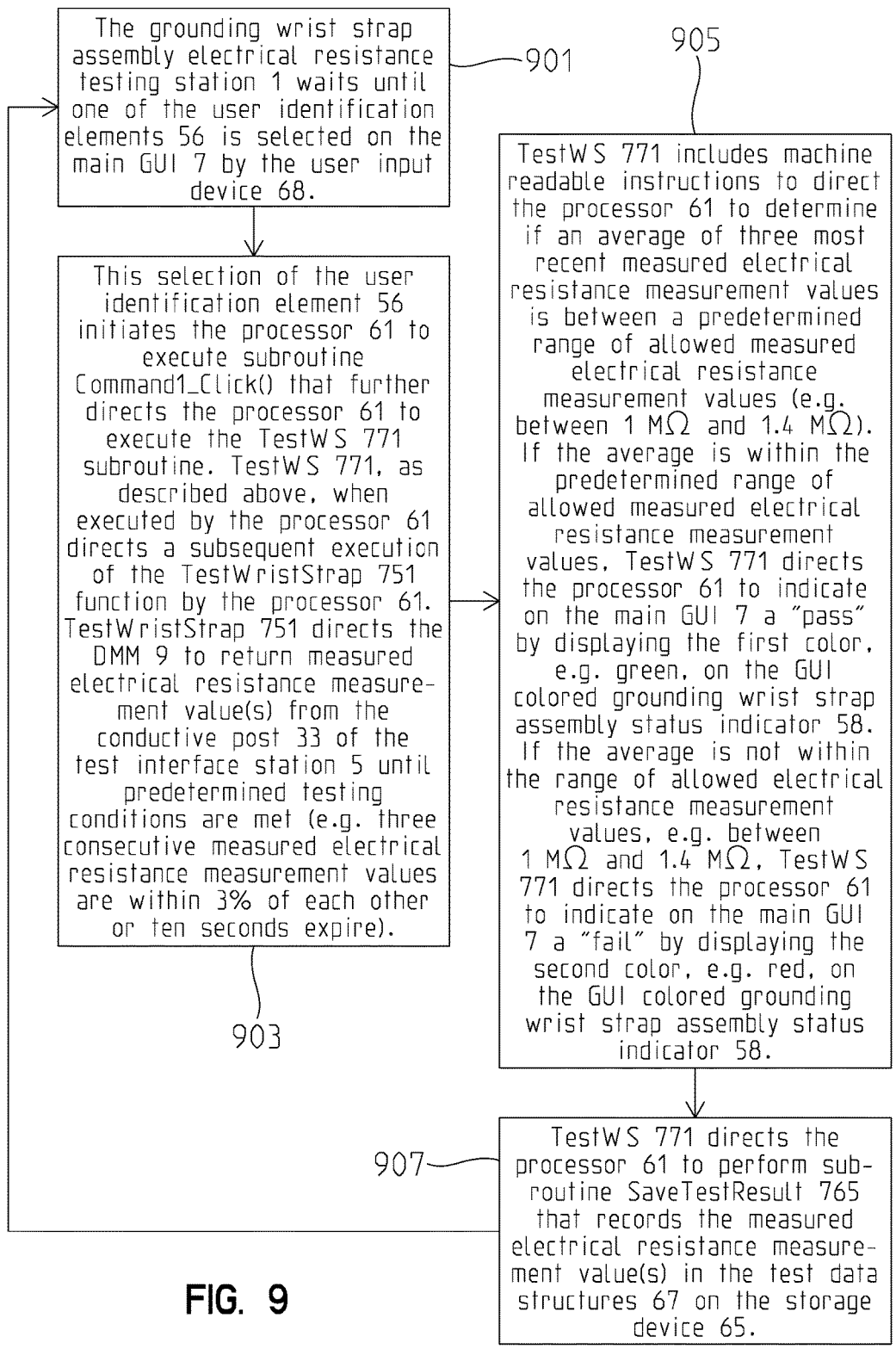
FIG. 9 shows another exemplary simplified operating process of an exemplary grounding wrist strap assembly electrical resistance testing system.

FIG. 9 shows an exemplary simplified operating process of an exemplary grounding wrist strap assembly electrical resistance testing system 1. At Step 901, the grounding wrist strap assembly electrical resistance testing station 1 waits until one of the user identification elements 56 is selected on the main GUI 7 by the user input device 68. Then, at Step 903, this selection of the user identification element 56 initiates the processor 61 to execute subroutine Command1_Click( ) that further directs the processor 61 to execute the TestWS 771 subroutine. TestWS 771, as described above, when executed by the processor 61 directs a subsequent execution of the TestWristStrap 751 function by the processor 61. TestWristStrap751 directs the DMM 9 to return measured electrical resistance measurement value(s) from the conductive post 33 of the test interface station 5 until predetermined testing conditions are met (e.g. three consecutive measured electrical resistance measurement values are within 3% of each other or ten seconds expire). At Step 905, TestWS 771 includes machine readable instructions to direct the processor 61 to determine if an average of three most recent measured electrical resistance measurement values is between a predetermined range of allowed measured electrical resistance measurement values (e.g. between 1 MΩ and 1.4 MΩ). If the average is within the predetermined range of allowed measured electrical resistance measurement values, TestWS 771 directs the processor 61 to indicate on the main GUI 7 a "pass" by displaying the first color, e.g. green, on the GUI colored grounding wrist strap assembly status indicator 58. If the average is not within the range of allowed electrical resistance measurement values, e.g. between 1 MΩ and 1.4 MΩ, TestWS 771 directs the processor 61 to indicate on the main GUI 7 a "fail" by displaying the second color, e.g. red, on the GUI colored grounding wrist strap assembly status indicator 58. Then at Step 907 TestWS 771 directs the processor 61 to perform subroutine SaveTestResult 765 that records the measured electrical resistance measurement value(s) in the test data structures 67 on the storage device 65. Upon completing TestWristStrap 751, the processor 61 directs the grounding wrist strap testing station 1 to return to Step 901.

Figure 10:
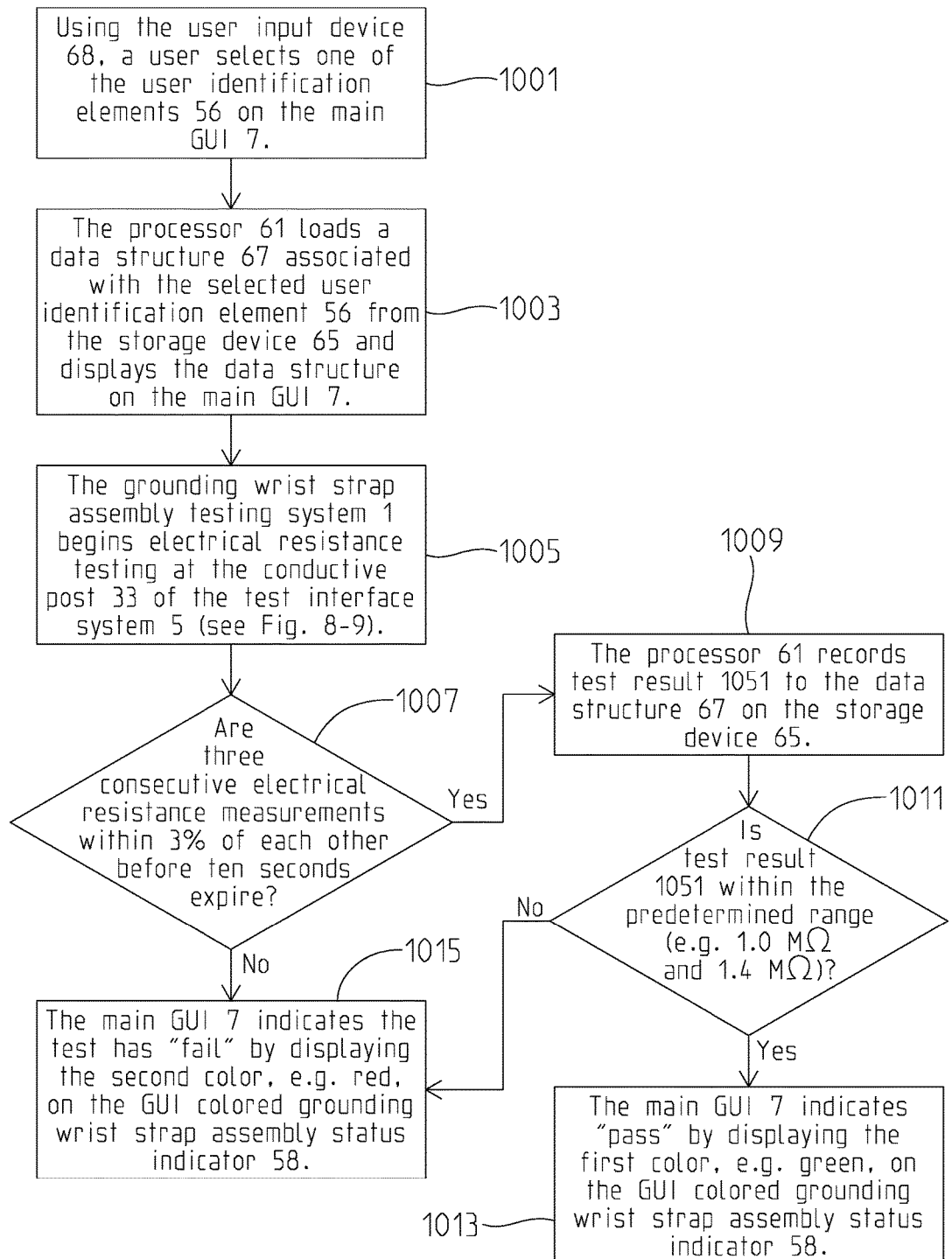
FIG. 10 shows another exemplary operating process associated with an operation of an exemplary grounding wrist strap assembly electrical resistance testing system.

FIG. 10 shows another exemplary operating process associated with an operation of an exemplary grounding wrist strap assembly electrical resistance testing system 1. At Step 1001, using the user input device 68, a user selects one of the user identification elements 56 on the main GUI 7 which directs the processor 61 to execute Command1_Click( ) 759. At Step 1003, following the machine readable instructions of Command1_Click( ) 759, the processor 61 then executes the TestWS 771 subroutine that further directs the execution of the ReadTestResult 767 subroutine to load a data structure 67 associated with the selected user identification element 56 from the storage device 65 and display the data structure 67 on the main GUI 7 as the list of past saved measured electrical resistance measurement value(s) 55. At Step 1005, the TestWS 771 subroutine directs the processor 61 by machine readable instructions to execute a TestWristStrap 751 function that initiates the grounding wrist strap assembly electrical resistance testing system 1 to begin electrical resistance testing at the conductive post 33 of the test interface system 5. At Step 1007, continuing the TestWristStrap 751 function, the processor 61 continues testing until predetermined testing conditions are met (e.g. three consecutive measurements are within 3% of each other or after ten seconds expire). In this example, if three consecutive measurements within 3% of each other, the processor 61 stops testing as directed by machine readable instructions of the TestWristStrap 751 function, then at Step 1009 the processor 61 records the test result 1051 to the data structure 67 on the storage device 65 as directed by the SaveTestResult 765 subroutine. In this example, if ten seconds expired during testing, then at Step 1015, as directed by machine readable instructions of the TestWristStrap 751 function, the processor 61 indicates on the main GUI 7 a "fail" by displaying the second color, e.g. red, on the GUI colored grounding wrist strap assembly status indicator 58. At Step 1011, continuing machine readable instructions of the TestWS 771 function, the processor 61 determines whether measured electrical resistance measurement values are within a range of predetermined allowed measured electrical resistance measurement values, e.g. between 1 MΩ and 1.4 MΩ. If the measured electrical resistance measurement values are within the predetermined range, then at Step 1013 the processor 61 indicates on the main GUI 7 a "pass" by displaying the first color, e.g. green, on the GUI colored grounding wrist strap assembly status indicator 58 as directed by machine readable instructions of the TestWS 771 function. If the measured values are outside the range, then at Step 1015, the processor 61 indicates on the main GUI 7 a "fail" by displaying the second color, e.g. red, on the GUI colored grounding wrist strap assembly status indicator 58 as directed by machine readable instructions of the TestWS 771 function.

Figure 11:
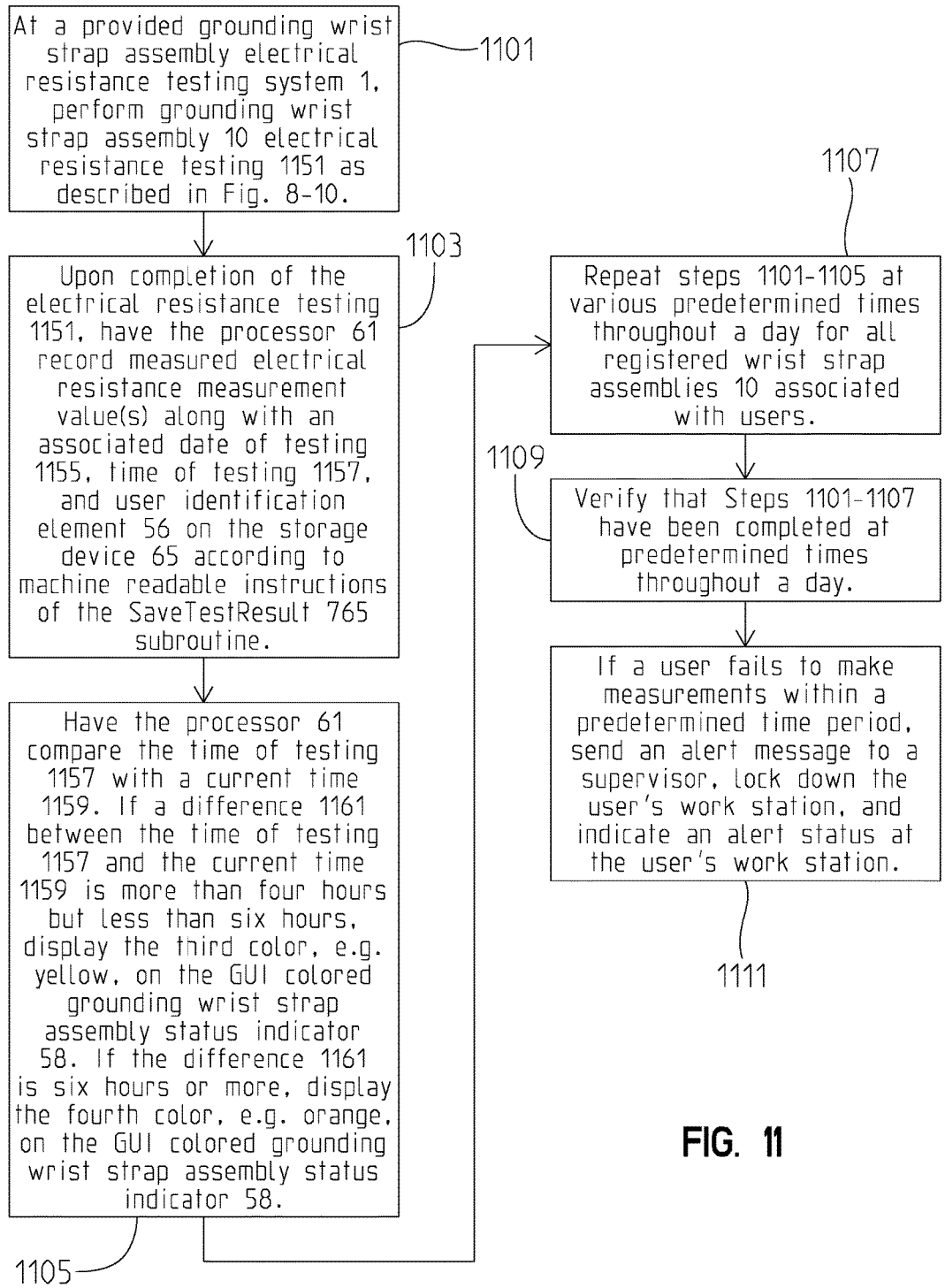
FIG. 11 shows an exemplary method of use of an exemplary grounding wrist strap assembly electrical resistance testing system with its status verification elements.

FIG. 11 shows an exemplary method of use of an embodiment of the invention. At Step 1101, at a provided grounding wrist strap assembly electrical resistance testing system 1, perform grounding wrist strap assembly 10 electrical resistance testing 1151 as described in FIG. 8-10. At Step 1103, upon completion of the electrical resistance testing 1151 as directed by machine readable instructions of the TestWristStrap 751 function, have the processor 61 record measured electrical resistance measurement value(s) along with an associated date of testing 1155, time of testing 1157, and user identification element 56 on the storage device 65 according to machine readable instructions of the SaveTestResult 765 subroutine. At Step 1105, as directed by machine readable instructions of the tmrCheckElapsedTime_Timer( ) 773 subroutine have the processor 61 compare the time of testing 1157 with a current time 1159. In accordance with the tmrCheckElapsedTime_Timer( ) 773 subroutine, if a difference 1161 between the time of testing 1157 and the current time 1159 is more than four hours but less than six hours, have the processor 61 display a third color, e.g. yellow, on the GUI colored grounding wrist strap assembly status indicator 58 of the main GUI 7. In further accordance with the tmrCheckElapsedTime_Timer( ) 773 subroutine, if the difference 1161 is greater than six hours, have the processor 61 display a fourth color, e.g. orange, on the GUI colored grounding wrist strap assembly status indicator 58 of the main GUI 7. At Step 1107, repeat steps 1101-1105 at various predetermined times throughout a day for all registered wrist strap assemblies 10 associated with users. At Step 1109, verify that Steps 1101-1107 have been completed at predetermined times throughout a day. At Step 1111, if a user fails to make measurements within a predetermined time period, send an alert message to a supervisor, lock down the user's workstation, and indicate an alert status at the user's workstation.

Figure 12:
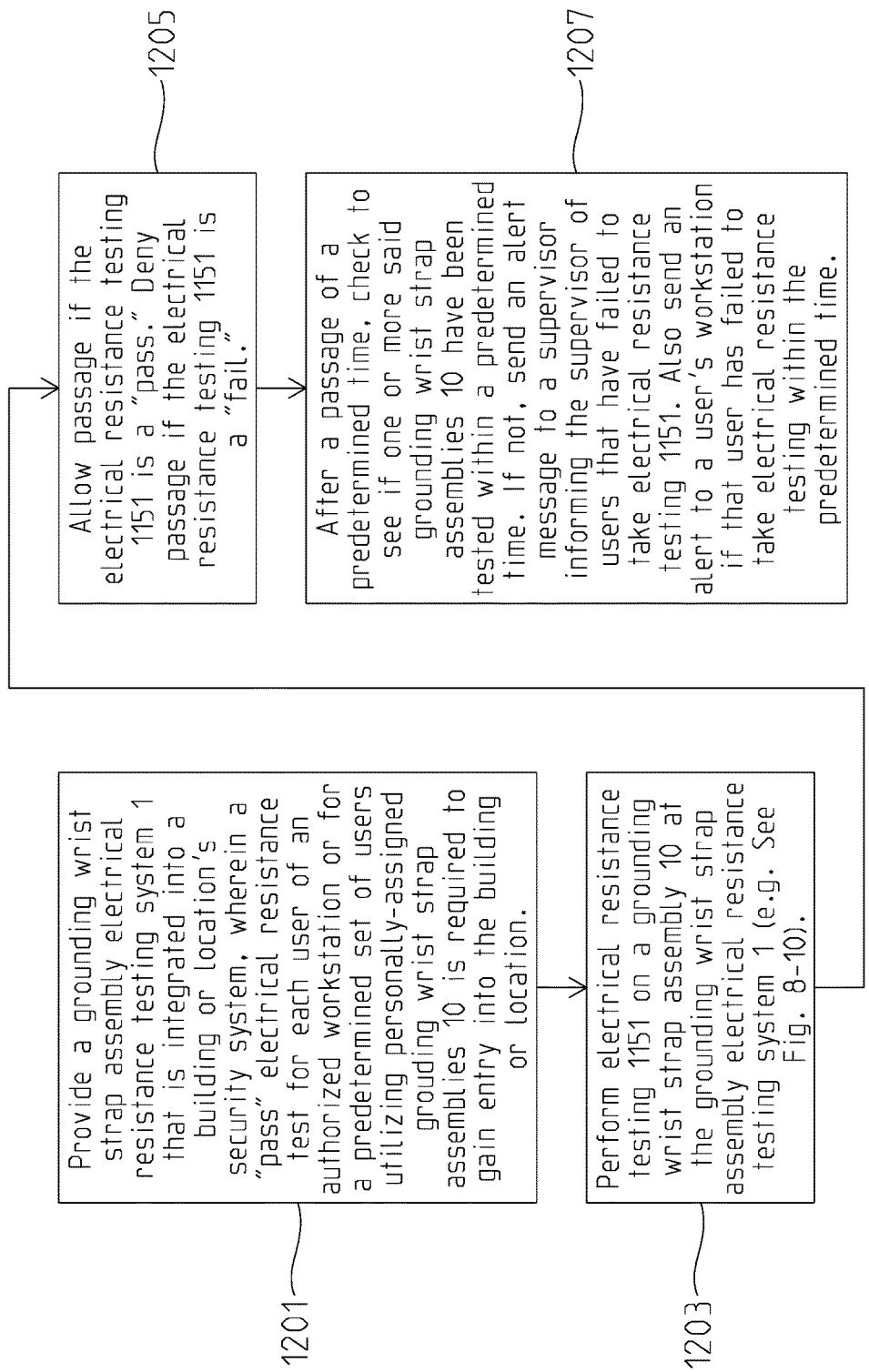
FIG. 12 shows a method of use of an alternative embodiment of invention grounding wrist strap assembly testing system that is integrated into a security system.

FIG. 12 shows another method of use of an illustrative example of the invention that is integrated into a location's security system. At Step 1201, provide a grounding wrist strap assembly electrical resistance testing system 1 that is integrated into a building or location's security system, wherein a "pass" electrical resistance test for each user of an authorized workstation or for a predetermined set of users utilizing personally-assigned grounding wrist strap assemblies 10 is required to gain entry into the building or location. At Step 1203, perform electrical resistance testing 1151 on a grounding wrist strap assembly 10 at the grounding wrist strap assembly electrical resistance testing system 1 (e.g. See FIG. 8-10.) At Step 1205, allow passage if the electrical resistance testing 1151 is a "pass." Deny passage if the electrical resistance testing 1151 is a "fail." At Step 1207, after a passage of a predetermined time from last the user used the testing station 1 to test the grounding wrist strap assembly 10, check to see if one or more said grounding wrist strap assemblies 10 have been tested within the predetermined time. If not, send an alert message to a supervisor informing the supervisor of users that have failed to take electrical resistance testing 1151. Also send an alert to a user's workstation if that user has failed to take electrical resistance testing within the predetermined time.

An alternative embodiment of the invention could also include an addition of a warning system included in an exemplary grounding wrist strap which begins to flash after a predetermined time period after a last testing at the testing station 1 of the grounding wrist strap assembly 10. This alternative embodiment would have a control section which detects when the testing station has been connected to the grounding wrist strap assembly 10 and resets on onboard timer. When the timer shows time elapsed has exceeded a predetermined time then the warning system on the grounding wrist strap would then begin to flash or operate (e.g., vibrate). The warning system can include anti-static discharge or electromagnetic interference structures which limit or prevent electrical interference or emissions from the warning structure such as through a secondary grounding or electrical insulation section. A low power system can also be used to minimize electrical interference or emissions from the warning device. A user would note that the warning system has activated and would then be reminded to seek testing of their grounding wrist strap 10. Others in the work area would also see the warning and be prompted to direct the user to seek testing.

Although the invention has been described in detail with reference to certain preferred embodiments, variations and modifications exist within the spirit and scope of the invention as described and defined in the following claims.

The invention claimed is:

1. An electrostatic protection testing, monitoring, and human-machine visual interface system comprising:
   a processor configured to operate said electrostatic protection testing, monitoring, and human-machine visual interface system based on a plurality of machine readable instructions stored on a memory;
   a user input device, said user input device being in communication with said processor;
   said memory in communication with said processor;
   a display in communication with said processor;
   a main graphical user interface (GUI) generated by at least some of said plurality of machine readable instructions configured to generate and display said main GUI on said display, wherein said main GUI comprises a profile list including at least one selectable user identification element and at least one GUI colored grounding wrist strap assembly status indicator configured to selectively display a plurality of colors within said at least one said GUI colored grounding wrist strap assembly status indicator;
   a grounding wrist strap assembly including an adjustable wristband, a metal plate coupled to said adjustable wristband on an interior side of said adjustable wristband configured to provide an electrical connection with a user's wrist area's skin, an electrical terminal connector positioned on an external side of said adjustable wristband configured to connect with an electrical quick disconnect grounding wire connector, and a conductive coupler that connects said metal plate with said electrical terminal connector;
   an electrical resistance measuring device, the electrical resistance measuring device being in communication with the processor, wherein said electrical resistance device includes a conductive contact surface fitted to make contact with said metal plate of said grounding wrist strap that can allow the transmission of electrical signals, and a receiving receptacle designed to receive said electrical quick disconnect connector of said grounding wrist strap assembly and transmit electrical signals;
   wherein said plurality of machine readable instructions further comprise:
   instructions to generate an initial version of said main GUI;
   instructions that selectively enable a user selection of an element of said main GUI via said user input device comprising said selectable user identification element and to initiate electrical resistance testing of said grounding wrist strap assembly;
   instructions configured for controlling said processor to initiate operation of a timer or clock until a first stored instruction condition associated with a maximum time value of waiting for a user to perform said electrical resistance testing, wherein said first stored instruction comprises a condition where said grounding wrist strap assembly is detected by said electrical resistance measuring device as in contact with said metal plate and with said electrical quick disconnect connector secured within said receiving receptacle, wherein said system terminates said electrical resistance testing when said clock or timer exceeds said time value;
   instructions configured for controlling said processor to obtain a series of measured electrical resistance measurement values of said grounding wrist strap using said electrical resistance measuring device after said first stored instruction condition is met;
   instructions configured for controlling said processor to terminate said obtaining said series of measured electrical resistance measurement values when a second stored instruction condition is met;
   instructions configured for controlling said processor to store said plurality of consecutively measured said electrical resistance measurement values in said memory associated with said user and said electrical resistance testing of said grounding wrist strap;
   instructions configured for controlling said processor to determine an average of said series of consecutively measured said electrical resistance measurement values;
   instructions configured for controlling said processor to compare said average to a stored predetermined range of allowed measured electrical resistance measurement values;
   instructions configured for controlling said processor to graphically show a pass condition on said main GUI by displaying a pass color on said GUI colored grounding wrist strap assembly status indicator if said average value falls within said stored predetermined range of allowed measured electrical resistance measurement values;
   instructions configured for controlling said processor to graphically indicate a fail condition on said main GUI by displaying a second color on said GUI colored grounding wrist strap assembly status indicator if said average value falls outside said stored predetermined range of allowed measured electrical resistance measurement values;
   instructions configured for controlling said processor to record said average in a data file in said memory;
   instructions configured for controlling said processor to record a time and date of said electrical resistance testing of said grounding wrist strap associated with said user in said data file in said memory; and instructions configured for controlling said processor to record said pass condition or said fail condition associated with said electrical resistance testing of said grounding wrist strap and said user in said data file in said memory.

2. A system as in claim 1, wherein said electrical resistance measuring device comprises a digital multi-meter.

3. A system as in claim 1, wherein said recorded average is compared to a subsequent recorded average and a difference of at least two said recorded averages is taken by said processor and recorded in said data file in said memory.

4. A system as in claim 1, wherein said series of measured electrical resistance measurement values comprises three measured electrical resistance measurement values.

5. A system as in claim 1, wherein said first stored instruction condition comprises said clock or timer reaching ten seconds.

6. A system as in claim 1, wherein said second stored instruction condition comprises a condition where said processor detects that said series of consecutively measured electrical resistance measurement values are within a predetermined percentage of each other.

7. A system as in claim 1, wherein said stored predetermined range of allowed measured electrical resistance measurement values comprises from 1 to 1.4 M$\Omega$.

8. A system as in claim 1, wherein said memory further comprises another plurality of machine readable instructions configured to operate said processor to control said system comprising:
　instructions that, at predetermined time intervals, operate said processor to check stored said data file to determine whether passed electrical resistance tests have occurred for all predetermined user profiles having said selectable user identification elements shown on said main GUI within at least a first predetermined time range; and
　instructions that display a third color on said main GUI's GUI colored grounding wrist strap assembly status indicator if said processor detects that no passed test has occurred within said first predetermined time range.

9. A system as in claim 8, wherein said first predetermined time range comprises at least four hours.

10. A system as in claim 8, further comprising instructions that display another color on said GUI colored grounding wrist strap assembly status indicator if said processor detects that another predetermined condition has not occurred within a second predetermined time range.

11. A system as in claim 10, wherein said second predetermined time range comprises at least six hours.

12. An electrostatic protection testing, monitoring, and human-machine visual interface system including a system for controlling access into locations or workplaces associated with use of electrostatic safety systems comprising:
　a first system; and
　a second system, said second system comprising a system for controlling an entryway or location access point in proximity to and in electronic communication with said first system, wherein said entryway or location access point allows passage to a user in response to a pass condition within one or more predetermined time periods for a user associated with at least one grounding wrist strap assembly tested by said first system;
　wherein said first system comprises:
　　a processor configured to operate some or all of said electrostatic protection testing, monitoring, and human-machine visual interface system based on a plurality of machine readable instructions stored in a memory configured to operate at least said first system;
　　a user input device, said user input device being in communication with said processor;
　　said memory in communication with said processor;
　　a display in communication with said processor;
　　a main graphical user interface (GUI) generated by at least some of said plurality of machine readable instructions configured to generate and display said main GUI on said display, wherein said main GUI comprises a profile list including at least one selectable user identification element and at least one GUI colored grounding wrist strap assembly status indicator configured to selectively display a plurality of colors within said at least one said GUI colored grounding wrist strap assembly status indicator;
　　at least one said grounding wrist strap assembly including an adjustable wristband, a metal plate coupled to said adjustable wristband on an interior side of said adjustable wristband configured to provide an electrical connection with a user's wrist area's skin, an electrical terminal connector positioned on an external side of said adjustable wristband configured to connect with an electrical quick disconnect grounding wire connector, and a conductive coupler that connects said metal plate with said electrical terminal connector;
　　an electrical resistance measuring device, the electrical resistance measuring device being in communication with the processor, wherein said electrical resistance device includes a conductive contact surface fitted to make contact with said metal plate of said grounding wrist strap that can allow the transmission of electrical signals, and a receiving receptacle designed to receive said electrical quick disconnect connector of said grounding wrist strap assembly and transmit electrical signals;
　　wherein plurality of machine readable instructions further comprise:
　　instructions to generate an initial version of said main GUI;
　　instructions that selectively enable a user selection of an element of said main GUI via said user input device comprising said selectable user identification element and to initiate electrical resistance testing of said grounding wrist strap assembly;
　　instructions configured for controlling said processor to initiate operation of a timer or clock until a first stored instruction condition associated with a maximum time value of waiting for a user to perform said electrical resistance testing, wherein said first stored instruction comprises a condition where said grounding wrist strap assembly is detected by said electrical resistance measuring device as in contact with said metal plate and with said electrical quick disconnect connector secured within said receiving receptacle, wherein said system terminates said electrical resistance testing when said clock or timer exceeds said time value;
　instructions configured for controlling said processor to obtain a series of measured electrical resistance measurement values of said grounding wrist strap using said electrical resistance measuring device after said first stored instruction condition is met;
　instructions configured for controlling said processor to terminate said obtaining said series of measured electrical resistance measurement values when a second stored instruction condition is met;

instructions configured for controlling said processor to store said plurality of consecutively measured said electrical resistance measurement values in said memory associated with said user and said electrical resistance testing of said grounding wrist strap;

instructions configured for controlling said processor to determine an average of said series of consecutively measured said electrical resistance measurement values;

instructions configured for controlling said processor to compare said average to a stored predetermined range of allowed measured electrical resistance measurement values;

instructions configured for controlling said processor to graphically show a pass condition on said main GUI by displaying a pass color on said GUI colored grounding wrist strap assembly status indicator if said average value falls within said stored predetermined range of allowed measured electrical resistance measurement values;

instructions configured for controlling said processor to graphically indicate a fail condition on said main GUI by displaying a second color on said GUI colored grounding wrist strap assembly status indicator if said average value falls outside said stored predetermined range of allowed measured electrical resistance measurement values;

instructions configured for controlling said processor to record said average in a data file in said memory;

instructions configured for controlling said processor to record a time and date of said electrical resistance testing of said grounding wrist strap associated with said user in said data file in said memory; and instructions configured for controlling said processor to record said pass condition or said fail condition associated with said electrical resistance testing of said grounding wrist strap and said user in said data file in said memory.

13. A system as in claim 12, wherein said electrical resistance measuring device includes a digital multi-meter.

14. A system as in claim 12, wherein said recorded average is compared to a subsequent recorded average and a difference is taken by said processor and recorded in said memory.

15. A system as in claim 12, wherein said series of measured electrical resistance measurement values comprises three measured electrical resistance measurement values.

16. A system as in claim 12, wherein said first stored instruction condition comprises said clock reaching ten seconds.

17. A system as in claim 12, wherein said second stored instruction condition comprises said processor detecting that said series of consecutively measured electrical resistance measurement values are within 3% of each other.

18. A system as in claim 12, wherein said stored predetermined range of allowed measured electrical resistance measurement values is from 1 to 1.4 M$\Omega$.

19. A system as in claim 12, wherein said memory further comprises another plurality of machine readable instructions configured to operate said processor to control said system comprising:

instructions that, at predetermined time intervals, operate said processor to check stored said data file to determine whether passed electrical resistance tests have occurred for all predetermined user profiles having said selectable user identification elements shown on said main GUI within at least a first predetermined time range; and instructions that display a third color on said main GUI's GUI colored grounding wrist strap assembly status indicator if said processor detects that no passed test has occurred within said first predetermined time range.

20. A system as in claim 19, wherein said first predetermined time range is four hours.

21. A system as in claim 19, wherein said another plurality of machine readable instructions further comprise a second predetermined time range.

22. A system as in claim 21, wherein said second predetermined time range is six hours.

23. A method of using an electrostatic protection testing, monitoring, and human-machine visual interface system comprising:

providing a electrostatic protection testing, monitoring, and human-machine visual interface system comprising:

a processor configured to operate said electrostatic protection testing, monitoring, and human-machine visual interface system based on a plurality of machine readable instructions stored on a memory;

a user input device, said user input device being in communication with said processor;

said memory in communication with said processor;

a display in communication with said processor;

a main graphical user interface (GUI) generated by at least some of said plurality of machine readable instructions configured to generate and display said main GUI on said display, wherein said main GUI comprises a profile list including at least one selectable user identification element and at least one GUI colored grounding wrist strap assembly status indicator configured to selectively display a plurality of colors within said at least one said GUI colored grounding wrist strap assembly status indicator;

a grounding wrist strap assembly including an adjustable wristband, a metal plate coupled to said adjustable wristband on an interior side of said adjustable wristband configured to provide an electrical connection with a user's wrist area's skin, an electrical terminal connector positioned on an external side of said adjustable wristband configured to connect with an electrical quick disconnect grounding wire connector, and a conductive coupler that connects said metal plate with said electrical terminal connector;

an electrical resistance measuring device, the electrical resistance measuring device being in communication with the processor, wherein said electrical resistance device includes a conductive contact surface fitted to make contact with said metal plate of said grounding wrist strap that can allow the transmission of electrical signals, and a receiving receptacle designed to receive said electrical quick disconnect connector of said grounding wrist strap assembly and transmit electrical signals;

wherein said plurality of machine readable instructions further comprise:

instructions to generate an initial version of said main GUI;

instructions that selectively enable a user selection of an element of said main GUI via said user input device comprising said selectable user identification element and to initiate electrical resistance testing of said grounding wrist strap assembly;

instructions configured for controlling said processor to initiate operation of a timer or clock until a first stored instruction condition associated with a maximum time value of waiting for a user to perform said electrical resistance testing, wherein said first stored instruction comprises a condition where said grounding wrist strap assembly is detected by said electrical resistance measuring device as in contact with said metal plate and with said electrical quick disconnect connector secured within said receiving receptacle, wherein said system terminates said electrical resistance testing when said clock or timer exceeds said time value;

instructions configured for controlling said processor to obtain a series of measured electrical resistance measurement values of said grounding wrist strap using said electrical resistance measuring device after said first stored instruction condition is met;

instructions configured for controlling said processor to terminate said obtaining said series of measured electrical resistance measurement values when a second stored instruction condition is met;

instructions configured for controlling said processor to store said plurality of consecutively measured said electrical resistance measurement values in said memory associated with said user and said electrical resistance testing of said grounding wrist strap;

instructions configured for controlling said processor to determine an average of said series of consecutively measured said electrical resistance measurement values;

instructions configured for controlling said processor to compare said average to a stored predetermined range of allowed measured electrical resistance measurement values;

instructions configured for controlling said processor to graphically show a pass condition on said main GUI by displaying a pass color on said GUI colored grounding wrist strap assembly status indicator if said average value falls within said stored predetermined range of allowed measured electrical resistance measurement values;

instructions configured for controlling said processor to graphically indicate a fail condition on said main GUI by displaying a second color on said GUI colored grounding wrist strap assembly status indicator if said average value falls outside said stored predetermined range of allowed measured electrical resistance measurement values;

instructions configured for controlling said processor to record said average in a data file in said memory;

instructions configured for controlling said processor to record a time and date of said electrical resistance testing of said grounding wrist strap associated with said user in said data file in said memory; and instructions configured for controlling said processor to record said pass condition or said fail condition associated with said electrical resistance testing of said grounding wrist strap and said user in said data file in said memory;

attaching said grounding wrist strap assembly to said electrical resistance measuring device by holding said metal plate in contact with said conductive contact surface and connecting said electrical quick disconnect connector to said receiving receptacle;

initiating said electrical resistance testing by selecting said selectable user identification element from said main GUI with said user input device; and disconnecting said grounding wrist strap assembly from said metal plate and said electrical quick disconnect connector if said pass condition is determined, or sending an alert or warning message if said fail condition is determined.

24. A method as in claim 23, wherein said electrical resistance measuring device includes a digital multi-meter.

25. A method as in claim 23, wherein said recorded average is compared to a subsequent recorded average and a difference is taken by said processor and recorded in said memory.

26. A method as in claim 23, wherein said series of measured electrical resistance measurement values comprises three measured electrical resistance measurement values.

27. A method as in claim 23, wherein said first stored instruction condition comprises said clock reaching ten seconds.

28. A method as in claim 23, wherein said second stored instruction condition comprises said processor detecting that said series of consecutively measured electrical resistance measurement values are within 3% of each other.

29. A method as in claim 23, wherein said stored predetermined range of allowed measured electrical resistance measurement values is from 1 to 1.4 M$\Omega$.

30. A method as in claim 23, wherein said memory further comprises another plurality of machine readable instructions configured to operate said processor to control said system comprising:

instructions that, at predetermined time intervals, operate said processor to check stored said data file to determine whether passed electrical resistance tests have occurred for all predetermined user profiles having said selectable user identification elements shown on said main GUI within at least a first predetermined time range; and instructions that display a third color on said main GUI's GUI colored grounding wrist strap assembly status indicator if said processor detects that no passed test has occurred within said first predetermined time range.

31. A method as in claim 30, wherein said first predetermined time range is four hours.

32. A method as in claim 30, wherein said another plurality of machine readable instructions further comprise a second predetermined time range, wherein said second predetermined time range is six hours.

33. A method of using an electrostatic protection testing, monitoring, and human-machine visual interface system including a system for controlling access into locations or workplaces associated with use of electrostatic safety systems comprising:

providing a first system and a second system, said second system comprising a system for controlling an entryway or location access point in proximity to and in electronic communication with said first system, wherein said entryway or location access point allows passage to a user in response to a pass condition within one or more predetermined time periods for a user associated with at least one grounding wrist strap assembly tested by said first system;

wherein said first system comprises:

a processor configured to operate some or all of said electrostatic protection testing, monitoring, and human-machine visual interface system based on a plurality of machine readable instructions stored in a memory configured to operate at least said first system;
a user input device, said user input device being in communication with said processor;
said memory in communication with said processor;
a display in communication with said processor;
a main graphical user interface (GUI) generated by at least some of said plurality of machine readable instructions configured to generate and display said main GUI on said display, wherein said main GUI comprises a profile list including at least one selectable user identification element and at least one GUI colored grounding wrist strap assembly status indicator configured to selectively display a plurality of colors within said at least one said GUI colored grounding wrist strap assembly status indicator;
at least one said grounding wrist strap assembly including an adjustable wristband, a metal plate coupled to said adjustable wristband on an interior side of said adjustable wristband configured to provide an electrical connection with a user's wrist area's skin, an electrical terminal connector positioned on an external side of said adjustable wristband configured to connect with an electrical quick disconnect grounding wire connector, and a conductive coupler that connects said metal plate with said electrical terminal connector;
an electrical resistance measuring device, the electrical resistance measuring device being in communication with the processor, wherein said electrical resistance device includes a conductive contact surface fitted to make contact with said metal plate of said grounding wrist strap that can allow the transmission of electrical signals, and a receiving receptacle designed to receive said electrical quick disconnect connector of said grounding wrist strap assembly and transmit electrical signals;
wherein plurality of machine readable instructions further comprise:
instructions to generate an initial version of said main GUI;
instructions that selectively enable a user selection of an element of said main GUI via said user input device comprising said selectable user identification element and to initiate electrical resistance testing of said grounding wrist strap assembly;
instructions configured for controlling said processor to initiate operation of a timer or clock until a first stored instruction condition associated with a maximum time value of waiting for a user to perform said electrical resistance testing, wherein said first stored instruction comprises a condition where said grounding wrist strap assembly is detected by said electrical resistance measuring device as in contact with said metal plate and with said electrical quick disconnect connector secured within said receiving receptacle, wherein said system terminates said electrical resistance testing when said clock or timer exceeds said time value;
instructions configured for controlling said processor to obtain a series of measured electrical resistance measurement values of said grounding wrist strap using said electrical resistance measuring device after said first stored instruction condition is met;
instructions configured for controlling said processor to terminate said obtaining said series of measured electrical resistance measurement values when a second stored instruction condition is met;
instructions configured for controlling said processor to store said plurality of consecutively measured said electrical resistance measurement values in said memory associated with said user and said electrical resistance testing of said grounding wrist strap;
instructions configured for controlling said processor to determine an average of said series of consecutively measured said electrical resistance measurement values;
instructions configured for controlling said processor to compare said average to a stored predetermined range of allowed measured electrical resistance measurement values;
instructions configured for controlling said processor to graphically show a pass condition on said main GUI by displaying a pass color on said GUI colored grounding wrist strap assembly status indicator if said average value falls within said stored predetermined range of allowed measured electrical resistance measurement values;
instructions configured for controlling said processor to graphically indicate a fail condition on said main GUI by displaying a second color on said GUI colored grounding wrist strap assembly status indicator if said average value falls outside said stored predetermined range of allowed measured electrical resistance measurement values;
instructions configured for controlling said processor to record said average in a data file in said memory;
instructions configured for controlling said processor to record a time and date of said electrical resistance testing of said grounding wrist strap associated with said user in said data file in said memory; and
instructions configured for controlling said processor to record said pass condition or said fail condition associated with said electrical resistance testing of said grounding wrist strap and said user in said data file in said memory;
attaching said grounding wrist strap assembly to said electrical resistance measuring device by holding said metal plate in contact with said conductive contact surface and connecting said electrical quick disconnect connector to said receiving receptacle;
initiating said electrical resistance testing by selecting said selectable user identification element from said main GUI with said user input device; and
disconnecting said grounding wrist strap assembly from said metal plate and said electrical quick disconnect connector if said pass condition is determined, or sending an alert or warning message if said fail condition is determined; and
activating said second system to unlock said entryway or open said location access point if said pass condition is determined or denying access to said user at said entryway or location point if said fail condition is determined.

34. A method as in claim 33, wherein said electrical resistance measuring device includes a digital multi-meter.

35. A method as in claim 33, wherein said recorded average is compared to a subsequent recorded average and a difference is taken by said processor and recorded in said memory.

36. A method as in claim 33, wherein said series of measured electrical resistance measurement values comprises three measured electrical resistance measurement values.

37. A method as in claim 33, wherein said first stored instruction condition comprises said clock reaching ten seconds.

38. A method as in claim 33, wherein said second stored instruction condition comprises said processor detecting that said series of consecutively measured electrical resistance measurement values are within 3% of each other.

39. A method as in claim 33, wherein said stored predetermined range of allowed measured electrical resistance measurement values is from 1 to 1.4 MΩ.

40. A method as in claim 33, wherein said memory further comprises another plurality of machine readable instructions configured to operate said processor to control said system comprising:
- instructions that, at predetermined time intervals, operate said processor to check stored said data file to determine whether passed electrical resistance tests have occurred for all predetermined user profiles having said selectable user identification elements shown on said main GUI within at least a first predetermined time range; and
- instructions that display a third color on said main GUI's GUI colored grounding wrist strap assembly status indicator if said processor detects that no passed test has occurred within said first predetermined time range.

41. A method as in claim 40, wherein said first predetermined time range is four hours.

42. A method as in claim 40, wherein said another plurality of machine readable instructions further comprise a second predetermined time range, wherein said second predetermined time range is six hours.

\* \* \* \* \*